US009000960B2

(12) United States Patent
D'Souza et al.

(10) Patent No.: US 9,000,960 B2
(45) Date of Patent: Apr. 7, 2015

(54) HIGH-ORDER AND NESTED REDUNDANCIES IN TIME-INTERLEAVED ADCS

(71) Applicant: Semtech Corporation, Camarillo, CA (US)

(72) Inventors: Sandeep Louis D'Souza, Redondo Beach, CA (US); Krishna Shivaram, Torrance, CA (US); Craig Allison Hornbuckle, Rolling Hills Estates, CA (US)

(73) Assignee: Semtech Corporation, Camarillo, CA (US)

( * ) Notice: Subject to any disclaimer, the term of this patent is extended or adjusted under 35 U.S.C. 154(b) by 79 days.

(21) Appl. No.: 13/944,826

(22) Filed: Jul. 17, 2013

(65) Prior Publication Data

US 2015/0022385 A1 Jan. 22, 2015

(51) Int. Cl.
*H03M 1/06* (2006.01)
*H03M 1/50* (2006.01)
*H03M 1/10* (2006.01)

(52) U.S. Cl.
CPC .............. *H03M 1/50* (2013.01); *H03M 1/1071* (2013.01)

(58) Field of Classification Search
CPC .................................................... H03M 1/0617
USPC .......... 341/118, 159, 155, 120, 161, 141, 122
See application file for complete search history.

(56) References Cited

U.S. PATENT DOCUMENTS

| 7,932,845 B2 * | 4/2011 | Sheng et al. .................. 341/120 |
| 2012/0212531 A1 * | 8/2012 | Yamada et al. ................. 347/10 |

* cited by examiner

*Primary Examiner* — Jean B Jeanglaude
(74) *Attorney, Agent, or Firm* — McDermott Will & Emery LLP

(57) ABSTRACT

Examples are provided for time-interleaved analog-to-digital conversion with redundancy. The redundancy may include high-order and nested redundancies. An apparatus may include multiple analog-to-digital converter (ADC) blocks coupled to one another to form a time-interleaved ADC. Each ADC block may include multiple ADC slices, wherein a count of the ADC blocks is M and some of the ADC slices may be redundant slices. A clock circuit may be configured to provide multiple clock signals. A portion N of M ADC blocks may be configured to be active, in a normal mode of operation, where N and M are integer numbers and N is smaller than M. A remaining portion of the M ADC blocks may be redundant ADC blocks, one or more of which may be selectively active, in a healing mode of operation, and be swapped for one or more failed ADC blocks using the plurality of clock signals.

20 Claims, 13 Drawing Sheets

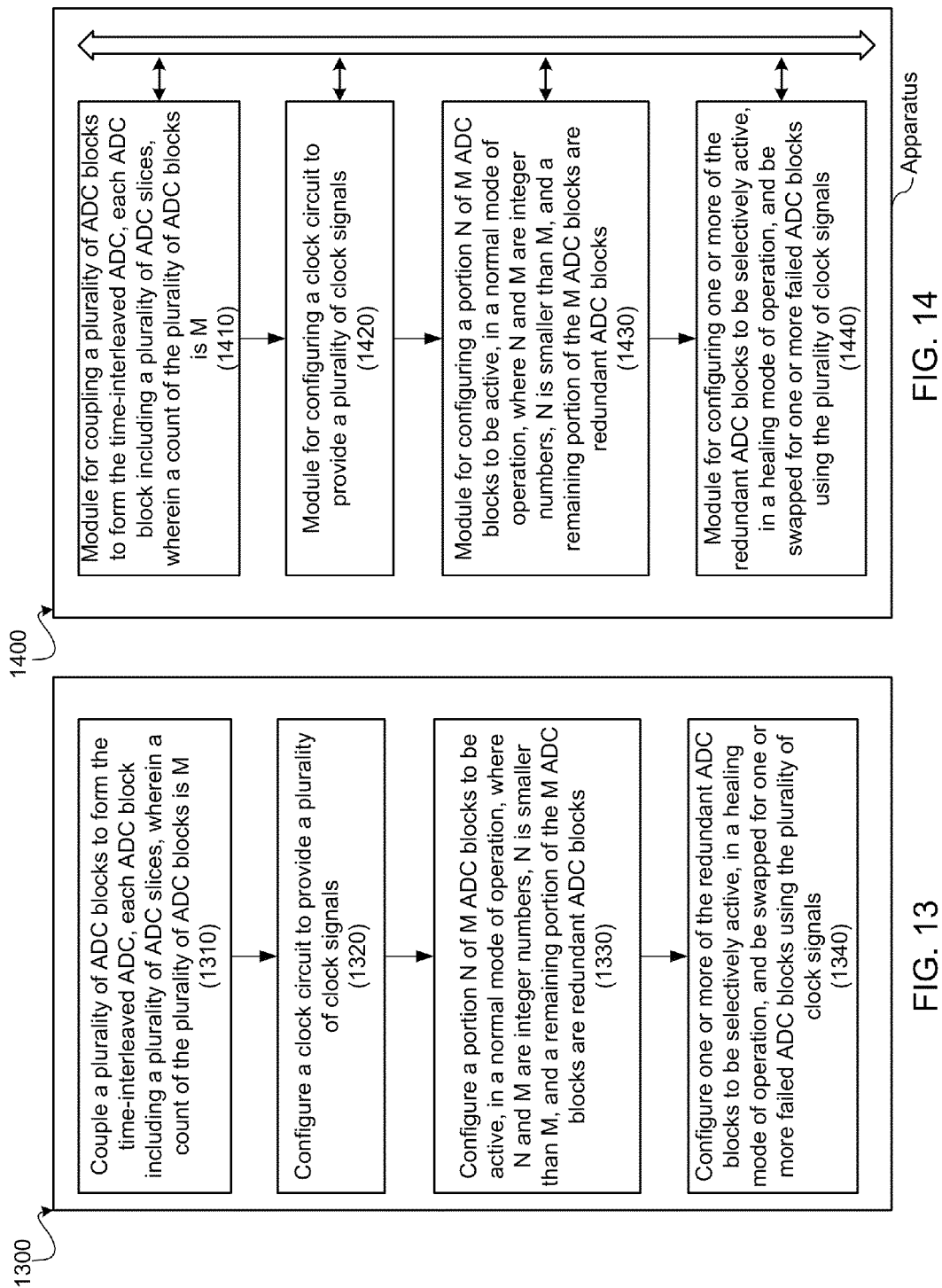

US 9,000,960 B2

HIGH-ORDER AND NESTED REDUNDANCIES IN TIME-INTERLEAVED ADCS

FIELD

The disclosure relates in general to mixed signal systems, and more particularly, to high-order and nested redundancies in time-interleaved analog-to-digital converters (ADCs).

BACKGROUND

Many systems such as digital and mixed signal systems may include multiple similar units. For example, a mixed signal system such as a communication system (e.g., a 100 GHz coherent transceiver) may be subdivided into one or more sub-systems including analog-to-digital converters (ADCs), digital-to-analog converters (DACs), and/or serializer-deserializers (SerDeses). Each of the subsystems may, in turn, consist of a number of similar units. For instance, an ADC may be built with hundreds of (e.g., 512 or more) successive-approximation register (SAR) units. A serious concern in such multi-unit systems is the system-level effect of any failure in one or more of the units of the multi-unit system. For example, even one bad SAR unit in an ADC with multiple SAR units may significantly impact the effective number of bits (ENOB) of the ADC.

SUMMARY

In one aspect of the disclosure, examples are provided for a time-interleaved analog-to-digital converter (ADC) with redundancy. The redundancy may include high-order (e.g., having an order of two or higher) and nested redundancies. An apparatus may include multiple analog-to-digital converter (ADC) blocks coupled to one another to form a time-interleaved ADC. Each ADC block may include multiple ADC slices, wherein a count of the ADC blocks is M. A clock circuit may be configured to provide multiple clock signals. A portion N of M ADC blocks may be configured to be active, in a normal mode of operation, where N and M are integer numbers and N is smaller than M. A remaining portion of the M ADC blocks may be redundant ADC blocks, and one or more of the redundant ADC blocks may be configured to be selectively active, in a healing mode of operation, and be swapped for one or more failed ADC blocks using the plurality of clock signals.

In another aspect of the disclosure, an example method for providing redundancy in a time-interleaved analog-to-digital converter (ADC) may include coupling multiple ADC blocks to form the time-interleaved ADC. Each ADC block may include multiple ADC slices, and a count of the ADC blocks is M. A clock circuit may be configured to provide a number of clock signals. A portion N of M ADC blocks may be configured to be active, in a normal mode of operation, where N and M are integer numbers and N is smaller than M. A remaining portion of the M ADC blocks may be redundant ADC blocks. One or more of the redundant ADC blocks may be configured to be selectively active, in a healing mode of operation, and to be swapped for one or more failed ADC blocks using the clock signals.

In yet another aspect of the disclosure, a non-transitory machine-readable medium may include instructions stored therein; the instructions may be executable by one or more processors to facilitate performing a method for healing a time-interleaved analog-to-digital converter (ADC). The method may include coupling a plurality of ADC blocks to form the time-interleaved ADC, each ADC block including multiple ADC slices, where a count of the ADC blocks is M; configuring a clock circuit to provide a plurality of clock signals; configuring a portion N of M ADC blocks to be active, in a normal mode of operation, where N and M are integer numbers, N is smaller than M, and a remaining portion of the M ADC blocks are redundant ADC blocks; and configuring one or more of the redundant ADC blocks to be selectively active, in a healing mode of operation, and be swapped for one or more failed ADC blocks using the clock signals.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

BRIEF DESCRIPTION OF THE DRAWINGS

FIG. 13 is a flow diagram illustrating an example of a method for providing high-order and nested redundancy in an ADC.

FIG. 14 is a diagram illustrating an exemplary apparatus including modules of an ADC with high-order and nested redundancy schemes.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding. Please note that the term "example" is used herein as a noun or an adjective.

The subject technology is directed to providing high-order (e.g., having an order of two or higher) and nested redundancy in a mixed-signal system such as an analog-to-digital converter (ADCs), a digital-to-analog converter (DAC), or a serializer-deserializer (SerDes). The mixed-signal system may include a number of similar blocks, each block including a number of similar units. In one or more implementations, the redundancy scheme may be a high-order redundancy that is provided at the block level. In other implementations, the redundancy schemes may further include a unit-level redundancy and a nested redundancy (e.g., redundancy-in-redundancy) that is provided at both unit level and the block level. The nested redundancy scheme may include electronic redundancy, which can be implemented, for example, at the unit level without adding any physical redundancy.

In such multi-block systems, the production yield of the system may be seriously affected by the yield of the individual units of the individual blocks. For instance, an ADC may be built of many blocks and can include hundreds of (e.g., 512 or more) successive-approximation register (SAR) units. In an ADC with 32-SAR units, for example, a yield of 60% may require a yield of approximately 99.9% for the individual SAR units. The yield of the individual SAR units may be impacted by, for instance, high speed comparator resolution, comparator offset cancellation range, process variation of capacitances of the array capacitors, particle defects on the semiconductor wafer, or other factors. The high-level and nested redundancy schemes of the subject technology can substantially reduce the required yield of a SAR unit and align the required yield of a SAR unit to that achievable by current and future semiconductor processes used for manufacturing integrated circuits such as Silicon CMOS, Silicon Germanium (SiGe) BiCMOS, FinFETs, or silicon-on-insulator (SOI) process technologies. The nested redundancy scheme may achieve significant chip-area and cost saving by including the electronic redundancy scheme.

Figure 1:
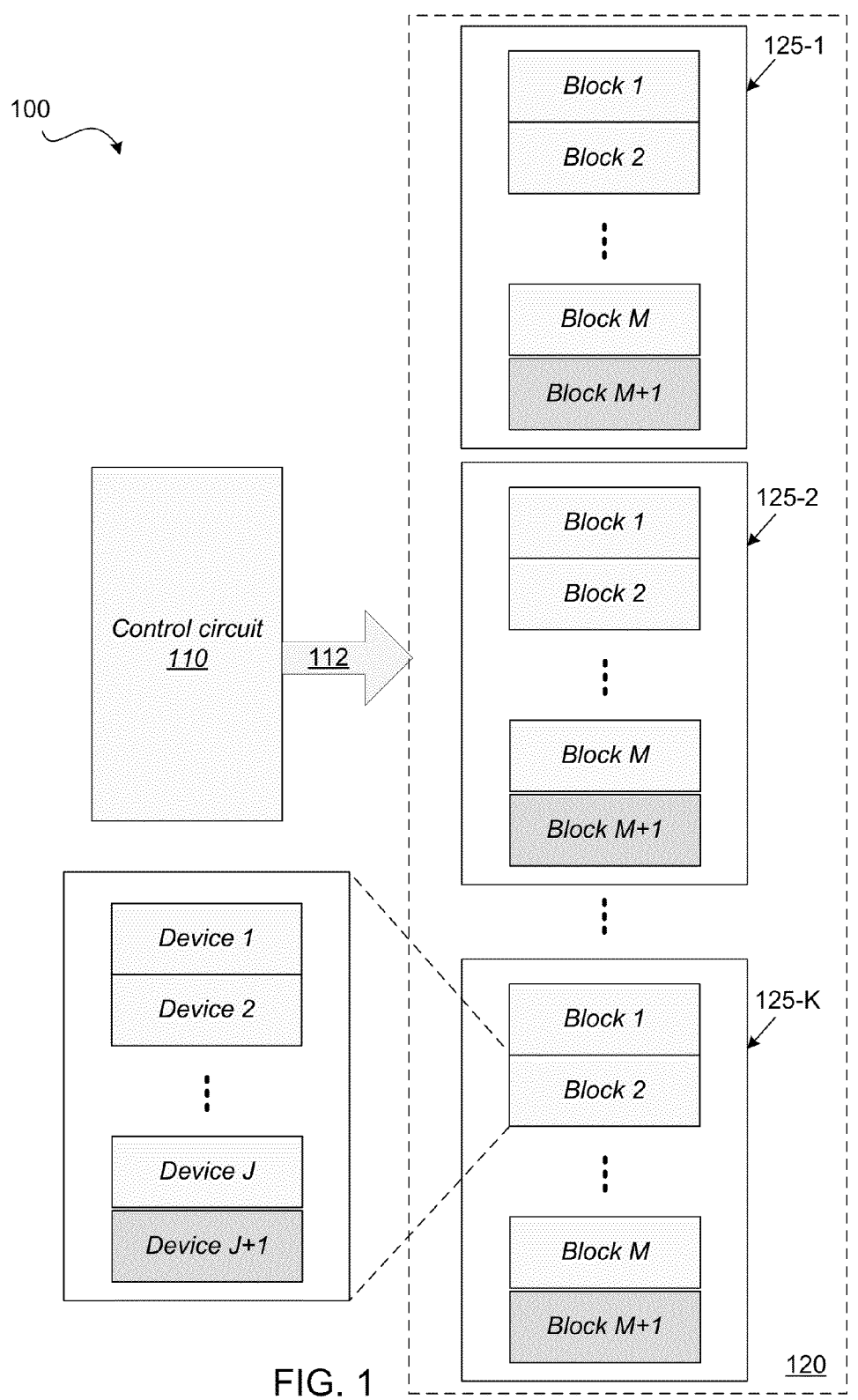
FIG. 1 is a block diagram of an example of a time-interleaved mixed-signal system with high-order and nested redundancies.

FIG. 1 is a block diagram of an example of a time-interleaved mixed-signal system 100 with high-order and nested redundancies. The mixed signal system 100 may include, but is not limited to, an ADC, a DAC, and a SerDes. The mixed signal system 100 includes, but is not limited to, a sub-system 120 including multiple groups 125 (e.g., 125-1 to 125-K) and a control circuit (e.g., a clock circuit) 110. Each group 125 may include a number of blocks (e.g., block 1 to block M+1); and each block may include a number of devices (e.g., device 1 to device J+1 shown for an exemplary block 2 of an exemplary group 125-K). The mixed-signal system 100 may include high-level and nested redundancy schemes to improve device yield requirement. Each device (e.g., device 1 to device J+1) may include an ADC slice formed by a successive-approximation register (SAR) unit and other electronic circuits.

In one or more aspects, the high-order redundancy may be implemented, for example, by allocating a block (e.g., block M+1) of each group 125 as a redundant (e.g., inactive) block. The redundant block M+1 may be configured to be activated by one or more control signals 112 issued by the control circuit 110, when one of the blocks (e.g., one of the blocks 1-M) of a group 125 (e.g., 125-K) fails. A block such as block 2 of group 125-K is recognized as failing when one or more of the devices (e.g., device 1 to device J+1) fails. In one or more aspects, the high-order redundancy may be implemented by a shared-block level redundancy scheme. In the shared-block level redundancy scheme, a block (e.g., block M+1) of one of two adjacent groups (e.g., group 125-1 and 125-2) may be allocated as a shared redundant block between the two adjacent blocks.

In one or more implementations, the redundancy may be implemented at the unit level (e.g., device level), for example, by allocating a device (e.g., device J+1) as the redundant device that can be activated by one or more control signals from the control circuit 110, when a failed device (e.g., one of device 1 to device J) is detected. The redundant device, once activated may provide for the lost output signal of the failed device. The device level redundancy may be implemented in a shared-device (e.g., shared-unit) level redundancy scheme, where a redundant device may be shared between two adjacent blocks (e.g., blocks 1 and 2 of the group 125-K).

In one or more aspects, the nested redundancy scheme may be implemented by combining the high-order redundancy schemes with a physical device-level redundancy scheme. For example, in each block (e.g., blocks 1 to block M+1), a redundant device (e.g., device J+1) may be provided such that when one of the devices (e.g., device 1 to device J) fails, the redundant device can replace the functionality of the failed device. However, if the failed block cannot be healed through the device-level redundancy (e.g., more than one device failed), a redundant block can replace the functionality of the failed block.

In one or more aspects, the nested redundancy scheme may be implemented by combining the high-order redundancy schemes with an electronic device-level redundancy scheme. For example, in each block (e.g., blocks 1 to block M+1), instead of providing a physical redundancy (e.g., by device J+1), electronic redundancy may be provided such that each device can provide, in a healing mode, one or more additional output signals that can provide for a lost output signal of a failed device, as discussed in more detail herein. However, if the failed block cannot be healed through electronic redundancy scheme, a redundant block can replace the functionality of the failed block. In one or more aspects, the nested redundancy may be implemented by replacing a first failed block by a redundant block and healing electronically at the device level the consecutive failed blocks.

Figures 2A, 2B:
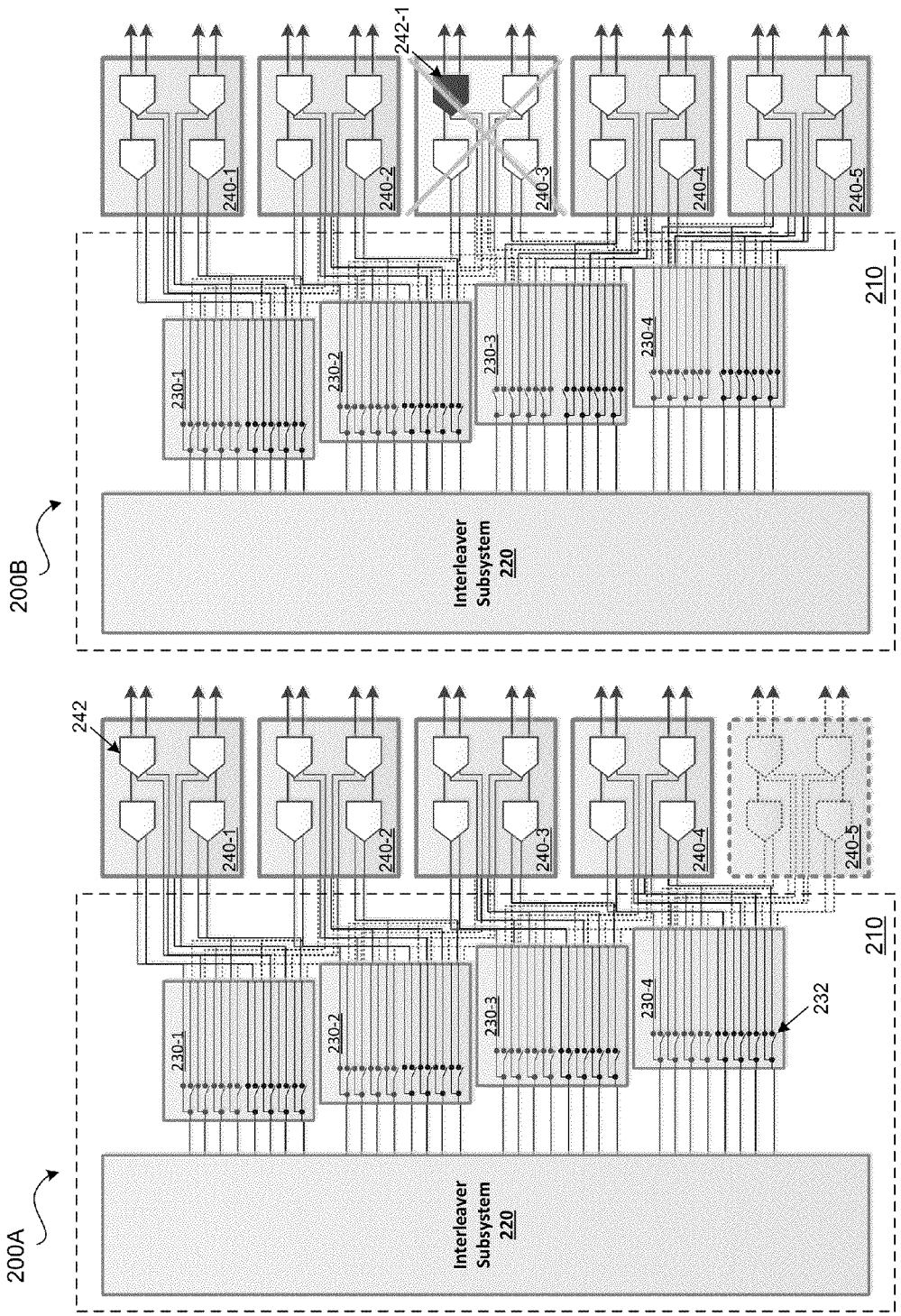
FIGS. 2A-2B are diagrams of examples of a time-interleaved analog-to-digital (ADC) including a number of ADC blocks using high-order and nested redundancy schemes.

FIGS. 2A-2B are diagrams of examples of a time-interleaved analog-to-digital (ADC) including a number of ADC blocks using high-order and nested redundancy schemes. The time-interleaved ADC 200A shown in FIG. 2A includes, but is not limited to, a clock circuit 210, and a number of ADC blocks 240 (e.g., 240-1 to 240-5). The clock circuit 210 includes, but is not limited to, an interleaver subsystem 220, and a number of selector circuits 230 (e.g., 230-1 to 230-4). The time-interleaved ADC 200A is shown to be operating in a normal mode of operation, where no failed ADC block is detected. In the time-interleaved ADC 200A, however, the block 240-5 is shown as a redundant (e.g., inactive) ADC block that is configured to be activated by the clock circuit 210, when any of the blocks 240-1 to 240-4 fails. The corresponding redundancy scheme in this case is a five-for-four block redundancy. Each ADC block 240 includes a number of ADC slices (e.g., devices) 242. The example ADC blocks shown in FIG. 2A are quad ADCs, each including four ADC slices 242.

The time-interleaved ADC 200A may operate at a sampling rate higher than the block sampling rate of each of the ADC blocks 240 and the block sampling rate may be higher than a sampling rate of each ADC slice. For example, for an ADC that has four blocks, the sampling rate may be four times the block sampling rate and the block sampling rate may be four times the sampling rate of each ADC slice. The higher sampling rate of the ADC 200A than the block sampling rate and the higher block sampling rate than the sampling rate of an ADC slice is made possible by the interleaver subsystem 220 that is configured to interleave multiple phases of a high-frequency clock signal to generate block-level and ADC slice-level clock signals. For example, if the sampling rate of the ADC 200A is 2 GS/s, the high-frequency clock signal may be a 2 GHz clock signal; the block-level clock signal may be 500 MHz clock signal; and the ADC slice-level clock signal may be 125 MHz clock signal. The 500 MHz clock signals may be generated at four different phase angles (e.g., 0, 90, 180, and 270 degrees) form the 2 GHz clock signal; and the 125 MHz clock signals may be generated at four different phase angles (e.g., 0, 90, 180, and 270 degrees) form the 500 MHz clock signal.

The selector circuits 230 may include multiple switches, where each switch is configured to couple a clock signal (e.g., generated by the interleaver subsystem 220) to a selected one of two clock lines. The selected clock line may facilitate swapping the redundant ADC block 240-5 for any one of the ADC blocks 240-1 to 240-4, in case a failed ADC block is detected.

The time-interleaved ADC 200B shown in FIG. 2B is structurally the same as the time-interleaved ADC 200A, and is shown to indicate a failed block (e.g., block 240-3). A block may be considered as failed, if one of the ADC slices (e.g., 242-1) fails. The failed ADC block 240-3 may be detected by a built-in self-test (BIST) engine, not shown in FIGS. 2A and 2B for clarity.

In one or more aspects, the ADC 200B may implement a nested redundancy scheme by using built-in electronic self-healing (e.g., electronic redundancy) for a failed ADC block (e.g., 240-3), in case the provisions for electronic redundancy, as described in more detail below, is made in the failed block. However, if the electronic redundancy cannot self-heal the defective ADC block (e.g., more than one ADC slice of the defective ADC block have failed), the defective ADC block can be swapped with the redundant ADC block 240-5.

Although the functionality of the high-order and nested redundancy schemes were described with respect to quad ADCs of FIGS. 2A and 2B, a more general high-order redundancy scheme of M-for-N for integer M and N and N<M can be similarly implemented. For example, ADC systems with nine-for-eight, eleven-for-ten, 13-for 12, and 17-for-16 redundancy schemes may be similarly implemented, and combined with ADC slice-level (e.g., device-level) physical and electronic redundancy schemes, as described above.

Figure 3:
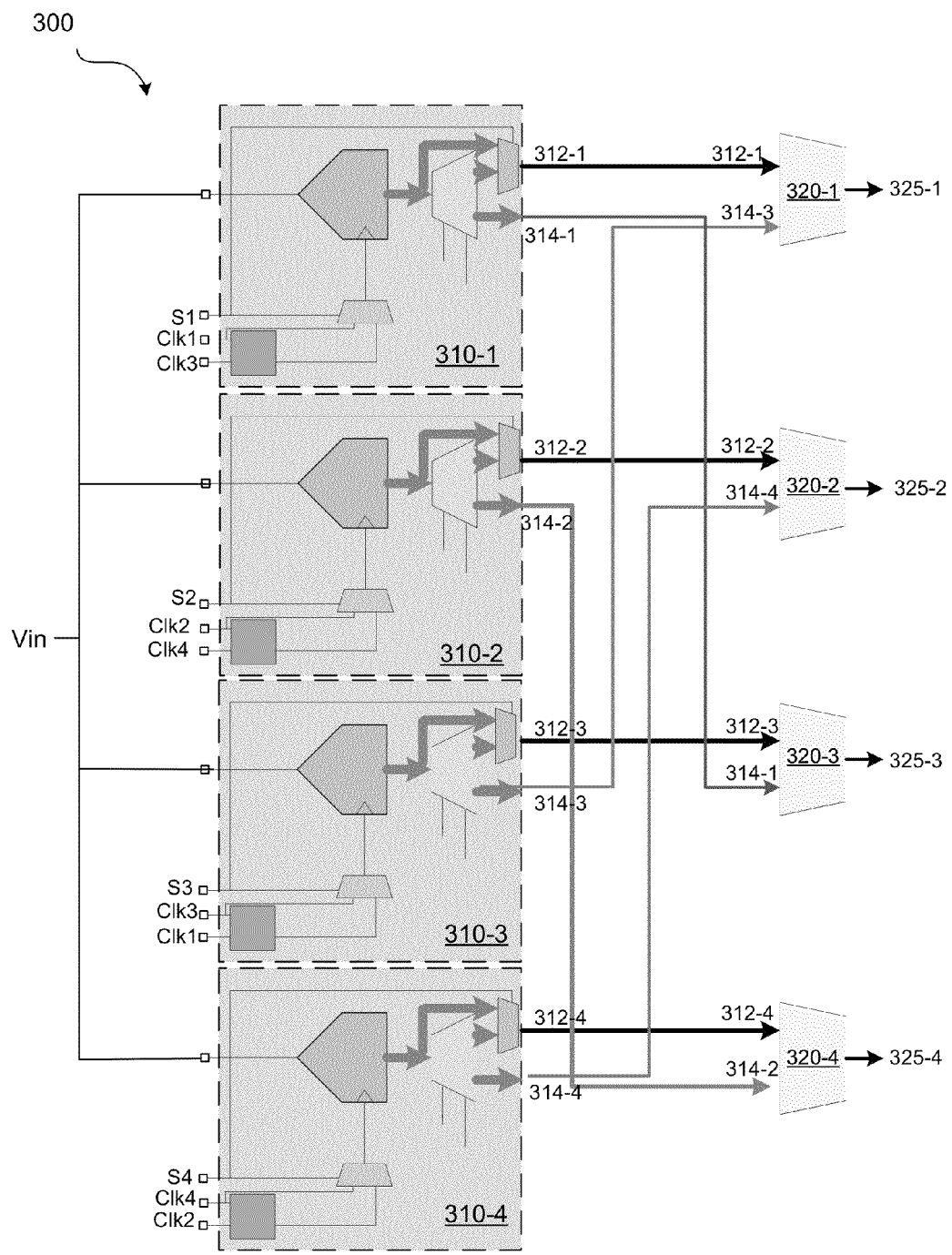
FIG. 3 is a block diagram of an example of a self-healed time-interleaved ADC quad.

FIG. 3 is a block diagram of an example of a self-healed time-interleaved ADC quad 300. The ADC quad 300 is used to describe an example use of the subject self-healing/electronic redundancy technique to compensate for a defective device (e.g., a defective ADC slice) of an ADC block. The ADC quad 300 includes four ADC slices 310 (e.g., 310-1 to 310-4). Each ADC slice 310 can operate in a normal or healing mode set by the corresponding mode select signals S1 to S4, which are in turn set by the BIST engine, not shown in FIG. 3 for clarity. For example, the ADC slice 310-1 can generate a single digital output signal 312-1, in the normal mode, or two digital output signals 312-1 and 314-1, in the healing mode. The digital signal 314-1 may be a redundant output signal that is used as a redundant (e.g., back-up) for the ADC slice 310-3.

In the normal mode of operation, each ADC slice (e.g., 310-1) runs at a sampling rate that is the same as the frequency of a clock signal (e.g., Clk1) associated with that ADC slice. In the healing mode of operation, however, the ADC slice (e.g., 310-1) is configured to run at a higher sampling rate that may be twice the frequency of the clock signal (e.g., Clk1) associated with that ADC slice. The higher sampling rate, in the healing mode of operation, allows the ADC slice (e.g., 310-1) to provide the additional digital output signal (e.g., 314-1) that can replace a lost digital output signal of a failed ADC slice (e.g., 310-3).

Four multiplexers 320 (e.g., 320-1 to 320-4) may select, for each ADC slice 310 one of a normal output 312 (312-1 to 312-4) or the redundant output 314 (314-1 to 314-4) generated by another ADC slice. For example, the redundant digital output signal 314-1, 314-2, 314-3 and 314-4 may, respectively, be applied to multiplexers 320-3, 320-4, 320-1, and 320-2. For instance, if ADC slice 310-2 goes bad, the corresponding normal output signal 312-2 may be lost and the calibration engine may set the mode select signal S4 to healing mode, so that the redundant output signal 314-4 be generated by the ADC slice 310-4 and provided to the multiplexer 320-2 to be passed as the output 325-2 of the defective ADC slice 2. Similarly, the output signals 325-1, 325-3 or, 325-4 of the ADC slices 310-1, 310-3, or 310-4 can be provided by ADC slices 310-3, 310-1, or 310-2, respectively, when one of the ADC slices 310-1, 310-3, or 310-4 fails.

In one or more implementation of the subject technology, other alternative arrangements for providing the electronic redundancy for each ADC slice using a different ADC slice than described above is possible. The arrangement, however, depends on the clock signals Clk1-Clk4 that are used for each ADC slice. For instance, the output redundancy arrangement described above can work because of the clock signal arrangement shown in FIG. 3, where, for example, Clk1 and Clk3 are coupled to ADC slice 310-1, and Clk3 and Clk1 are used as input clock signals of the ADC slice 310-3. It is understood that the clock signals Clk3 and Clk1 of the ADC slice 310-3 that supports (e.g., heals) the ADC slice 310-1, are configured to be at 180 degree phase angle with respect to the clock signals Clk1 and Clk3 of the ADC slice 310-1. Similarly, the clock signals Clk2 and Clk4 of the ADC slice 310-2 that supports (e.g., heals) the ADC slice 310-4, are at 180 degree phase angle with respect to the clock signals Clk4 and Clk2 of the ADC slice 310-4.

In one or more aspects, the disclosed electronic redundancy scheme can be used in larger ADCs than a quad ADC and can replace various physical redundancy schemes or be implemented with various physical redundancy schemes such as a five-for-four, nine-for-eight, eleven-for ten, 13-for-12, and 17-for-16 schemes, etc. In one or more implementations, each ADC slice may be configured to support more than one defective ADC slices, for example, by configuring the respective SAR units to operate at higher sampling rates that the double-rate discussed above. In one or more aspects, the output redundancy arrangement described above may be reconfigurable such that when an ADC slice (e.g., 310-1) that provides support for another ADC slice (e.g., 310-3) goes bad, the other ADC slice (e.g., 310-3) can receive support from one of the ADC slices 310-2 or 310-4.

Figure 4:
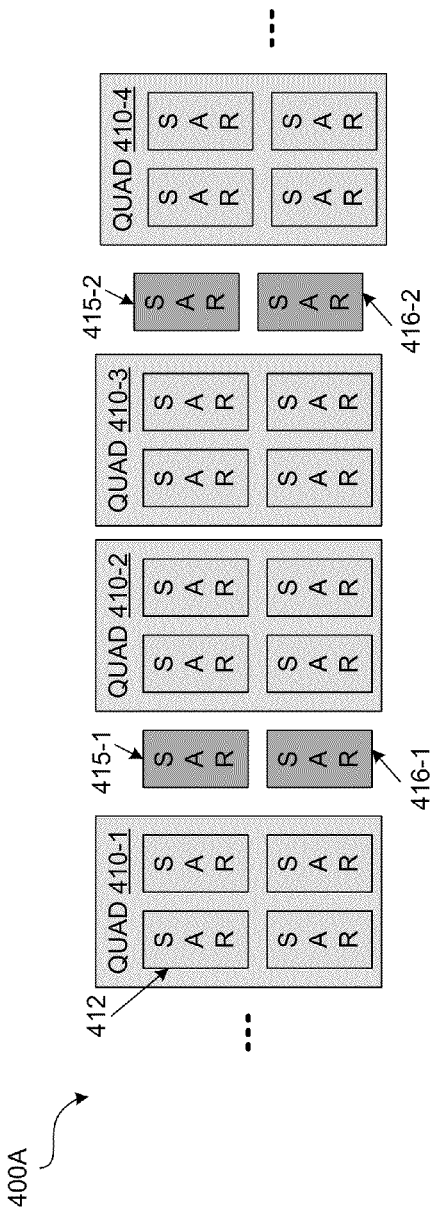
FIG. 4A is a diagram of an example of an ADC including a number of ADC quads with ADC slice redundancy.
FIG. 4B is a table including examples of implementation information regarding a number of high order and nested redundancy schemes.

FIG. 4A is a diagram of an example of an ADC 400A including a number of ADC quads 410 with ADC slice redundancy. The ADC 400A may include a number of ADC quads 410 (e.g., 410-1, 410-2, 410-3, 410-4 . . . ). Each ADC quad 410 is formed by four ADC slices, each including a SAR unit 412. The grouping of four ADC slices into one quad 410, may allow implementation of five-for-four slice redundancy scheme with the arrangement shown in FIG. 4A. In the shown arrangement, for each two adjacent ADC quads (e.g., 410-1 and 410-2), a pair of SAR units (e.g., 415-1 and 416-1) are provided as their physical redundant SAR units. For example, one of the two SAR units (e.g., 415-1) may be allocated as the redundant SAR unit for the quad ADC 410-1 and the other one (e.g., 416-1) may be allocated to the ADC quad 410-2. Similarly, the SAR units 415-2 and 416-2 may be used as the physical redundant SAR units for ADC slices 410-3 and 410-4, respectively. The ADC 400A may include more ADC quads and redundant SAR units than shown in FIG. 4A. In a similar arrangement, the pair of redundant SAR units may be added every four quads (instead of every two quads shown in FIG. 2A) to implement a nine-for-eight slice redundancy.

FIG. 4B is a table 400B including examples of implementation information regarding a number of high-order and nested redundancy schemes. The table 400B includes implementation information such as required SAR unit yield, area overhead, and implementation complexity effort associated with a number of redundancy scheme options. The listed redundancy scheme options include no redundancy, nine-for-eight quad, five-for-four quad, five-for-four slice, five-for-four shared, electronic slice, and nested electronic plus nine-for-eight quad schemes. The required SAR unit yields are provided at two levels of system (e.g., ADC) yield of 95% and 60%. The electronic slice scheme is shown to have the least area overhead, while requiring a moderate complexity effort. The nested electronic plus nine-for-eight quad scheme is shown to significantly improve upon the nine-for-eight quad scheme in terms of sensitivity to SAR unit yield, as the required SAR unit yields for the system yield of 60% is reduced from 99.20% to 82.25%, while the area overhead does not show a substantial increase.

Figure 5:
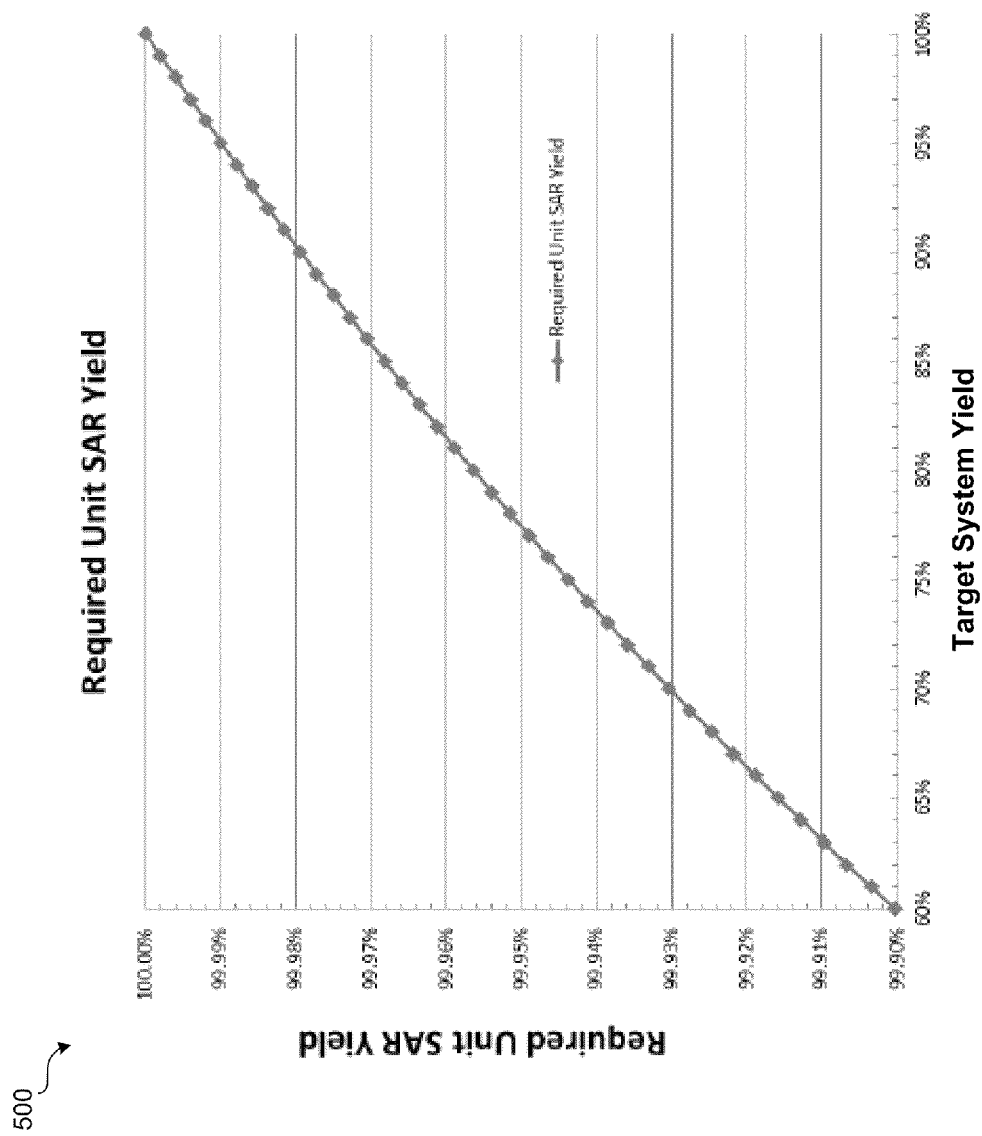
FIG. 5 is a diagram of an example of a yield-analysis plot for a transceiver with no redundancy.

FIG. 5 is a diagram of an example of a yield-analysis plot 500 for a transceiver with no redundancy. The plot 500 shows the yield analysis result for a 100 GHz coherent transceiver with no redundancy scheme. The transceiver has 4 ADCs each including 128 slices. The yield-analysis results show that the target system (e.g., transceiver) yield is highly sensitive to the SAR unit yield. For example, to achieve a target system yield of 95%, a SAR unit yield of >99.99% is required. Even a low target system yield of 60% demands a SAR unit yield of 99.9%, which is greater than the 3σ yield of 99.7%. The required SAR unit yield results seem to be consistent with the following equation:

$$\text{Required SAR yield} = (\text{System yield})^{(1/N)} \quad (1)$$

Where N is the number of SAR units in the system.

Figure 6:
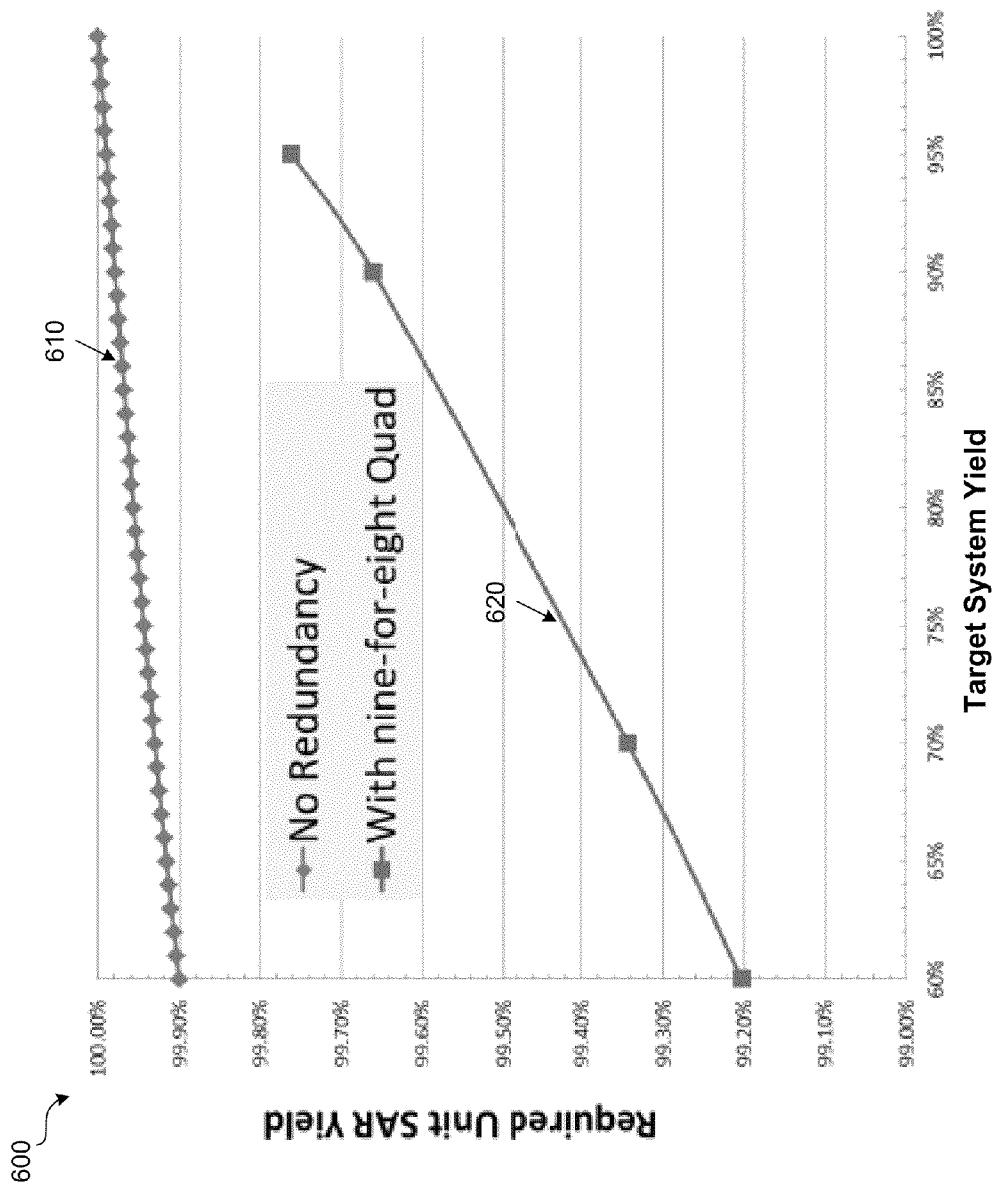
FIG. 6 is a diagram of an example of a yield-analysis plot for an ADC with high-order redundancy and no redundancy.

FIG. 6 is a diagram of an example of a yield-analysis plot 600 for an ADC with higher order-redundancy and no redundancy. The target system yields shown in the plot 600 are associated with a nine-for-eight quads redundancy scheme that has one redundant ADC quad for each eight ADC quad (e.g., four redundant ADC slices for each 32 ADC slices). For the no redundancy case shown by the curve 610, even at 60% target system yield level, a SAR unit yield level of approximately 99.90% is required. However, the nine-for-eight redundancy curve 620 shows that this redundancy scheme can lower the corresponding required SAR unit to 99.20%, which is still above 99%.

Figure 7:
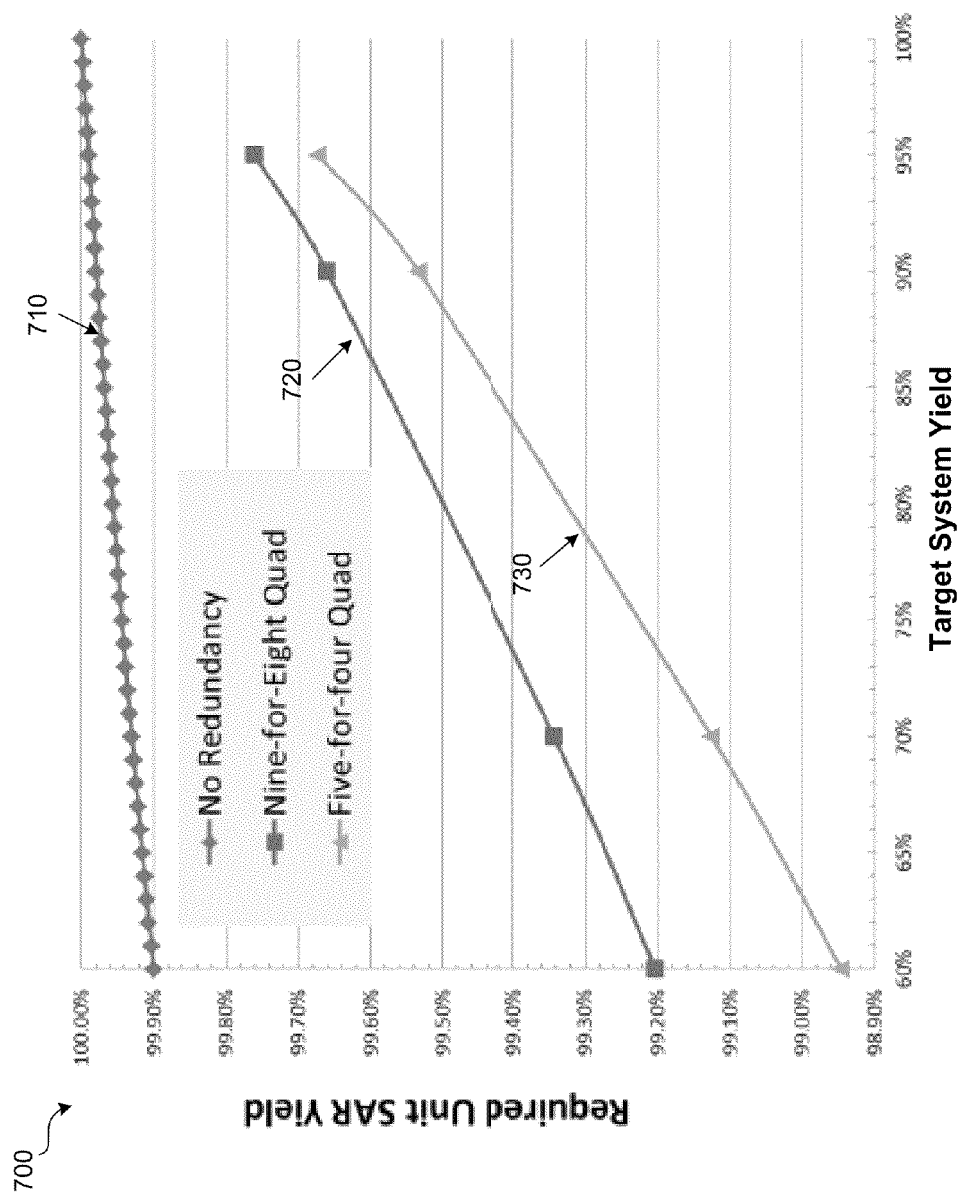
FIG. 7 is a diagram of an example of a yield-analysis plot for an ADC with high-order redundancies and no redundancy.

FIG. 7 is a diagram of an example of a yield-analysis plot 700 for an ADC with higher order-redundancies and no redundancy. The plot 700 includes the data for the plot 600 and the additional curve 730 that show the required SAR unit yield for a five-for-four quad ADC. The five-for-four quad ADC has four redundant ADC slices for each 16 ADC slices. The required SAR unit yield corresponding to the five-for-four quad ADC yields of 95% and 60% are, respectively, shown to be >99.67% and 98.95%, which are further relaxed with respect to the nine-for-eight scheme, as a higher degree of redundancy is provided.

Figure 8:
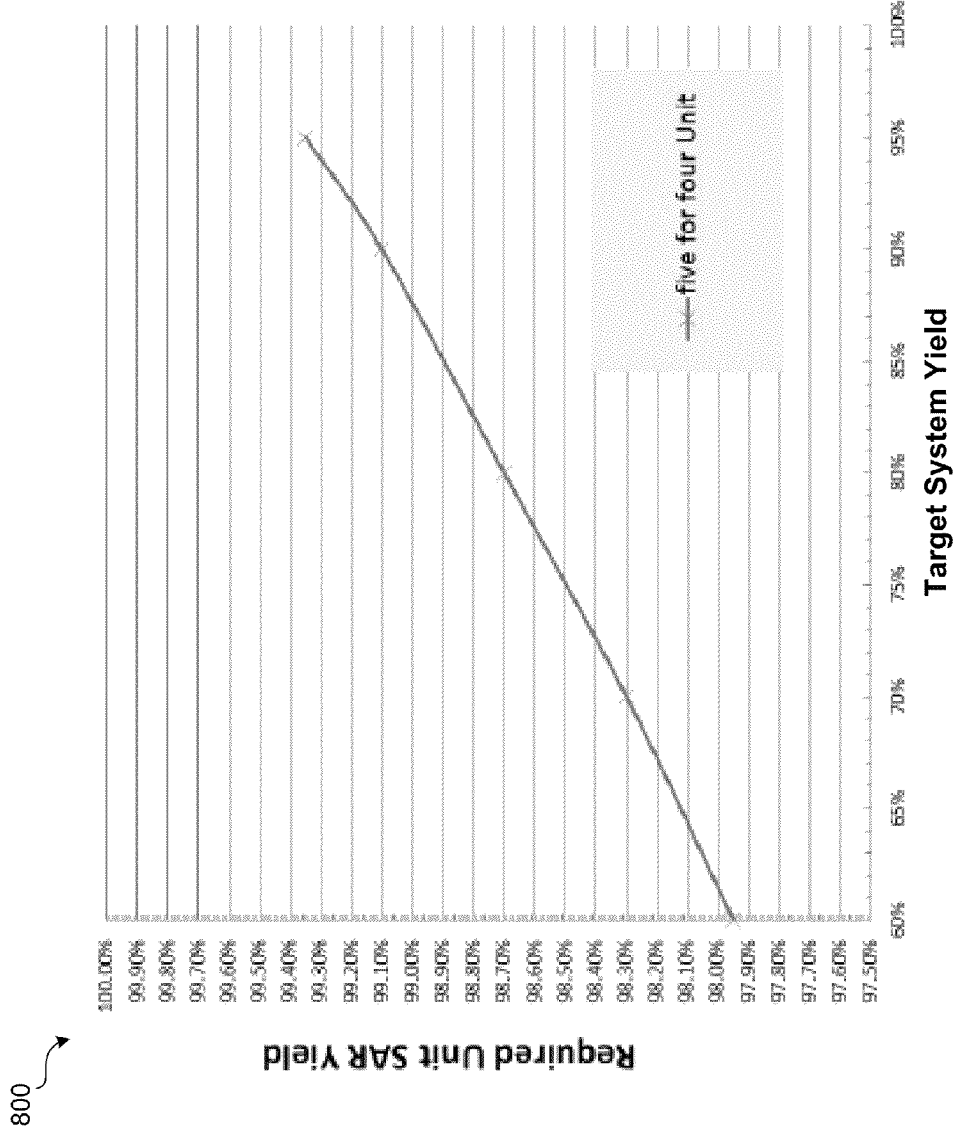
FIG. 8 is a diagram of an example of a yield-analysis plot for an ADC with unit-level redundancy.

FIG. 8 is a diagram of an example of a yield-analysis plot 800 for an ADC with unit-level redundancy. The plot 800 shows the yield analysis for a five-for-four ADC slice (e.g., SAR unit) redundancy, which provides 1 redundant SAR unit for each four SAR units (e.g., the scheme shown in FIG. 4A). This scheme can tolerate one failed SAR unit per four SAR units. The area overhead for this case is 25% and the SAR unit yield requirement show a small improvement over the previous schemes discussed above with respect to other redundancy schemes.

Figure 9:
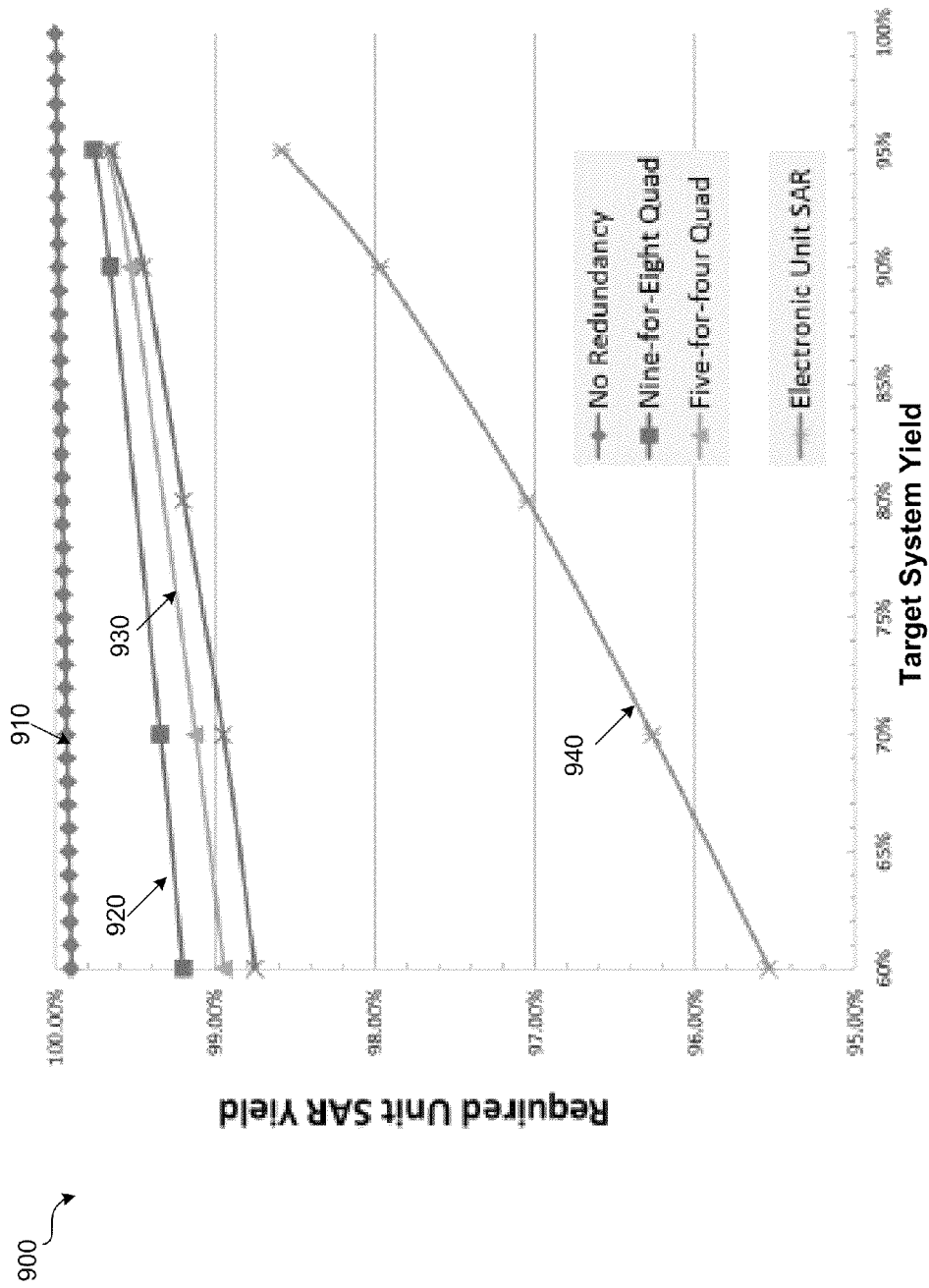
FIG. 9 is a diagram of an example of a yield-analysis plot for an ADC with various redundancy schemes.

FIG. 9 is a diagram of an example of a yield-analysis plot 900 for an ADC with various redundancy schemes. In the plot 900, curves 910, 920, and 930 are the same as the curves 710, 720, and 730 discussed above with respect to FIG. 7. Curve 940 is for an electronic redundancy with no physical redundancy (e.g., additional SAR unit), as discussed above with respect to FIG. 3. In this scheme in a quad ADC with four ADC slices, each ADC slice can operate in a healing mode, during which it can operate at a double sampling rate (e.g., turbo mode) and generate two digital output signals. One of the two digital output signals may replace a lost output signal of a failed ADC slice. For the electronic redundancy case, as shown by the curve 940, at the target system yields of 95.5% and 60%, the required SAR unit yields are >98.58% and >95.54%, respectively, which are significantly improved over the other schemes shown in FIG. 9. The electronic redundancy scheme does not significantly add to the chip area. The only additional area in this scheme is for a small area used by an additional clock circuit.

Figure 10:
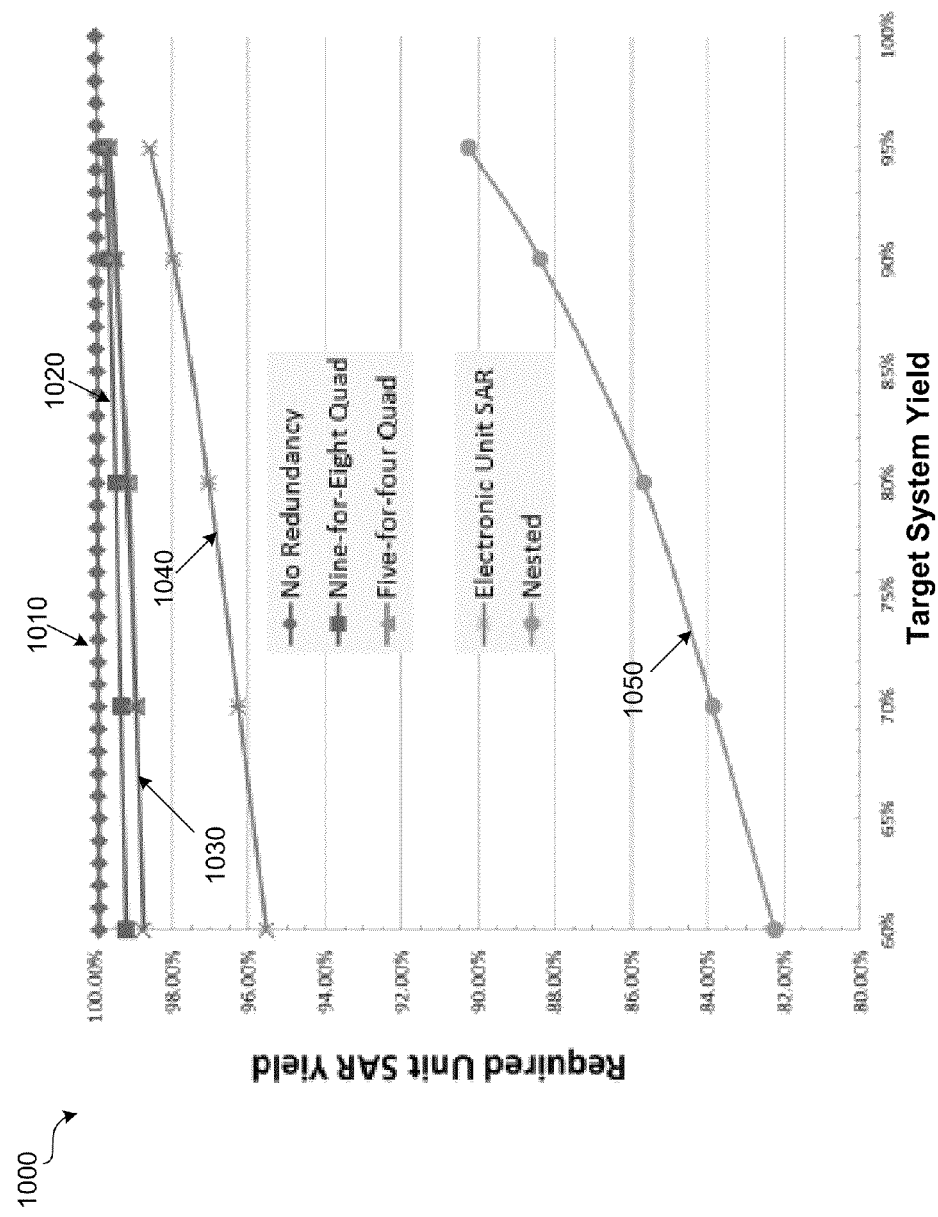
FIG. 10 is a diagram of an example of a yield-analysis plot for an ADC with various redundancy schemes.

FIG. 10 is a diagram of an example of a yield-analysis plot 1000 for an ADC with various redundancy schemes. In the plot 1000, curves 1010, 1020, 1030, and 1040 are the same as the curves 910, 920, 930, and 940, discussed above with respect to FIG. 9. Curve 1050 corresponds to a nested redundancy scheme in which a nine-for-eight quad scheme is combined with the electronic SAR unit redundancy. In this scheme, for each eight ADC quads one redundant ADC quad is provided; in addition, the electronic redundancy scheme as discussed above with respect to FIG. 3 is also implemented at the SAR unit level. A failed ADC quad in this scenario may be electronically healed if only one of the ADC slices (e.g., SAR units) of the failed ADC quad is detected to be defective. Otherwise, the failed ADC quad will be entirely replaced by the redundant ADC quad. In one or more aspects, a first failed ADC block may be replaced by a redundant ADC block and the consecutive failed ADC slices may be healed electronically. The curve 1050 for the nested scheme shows that at the target system yields of 95.5% and 60%, the required SAR unit yields are >90.25% and >82.25%, respectively, which are substantially improved over the other schemes shown in FIG. 10.

Figure 11:
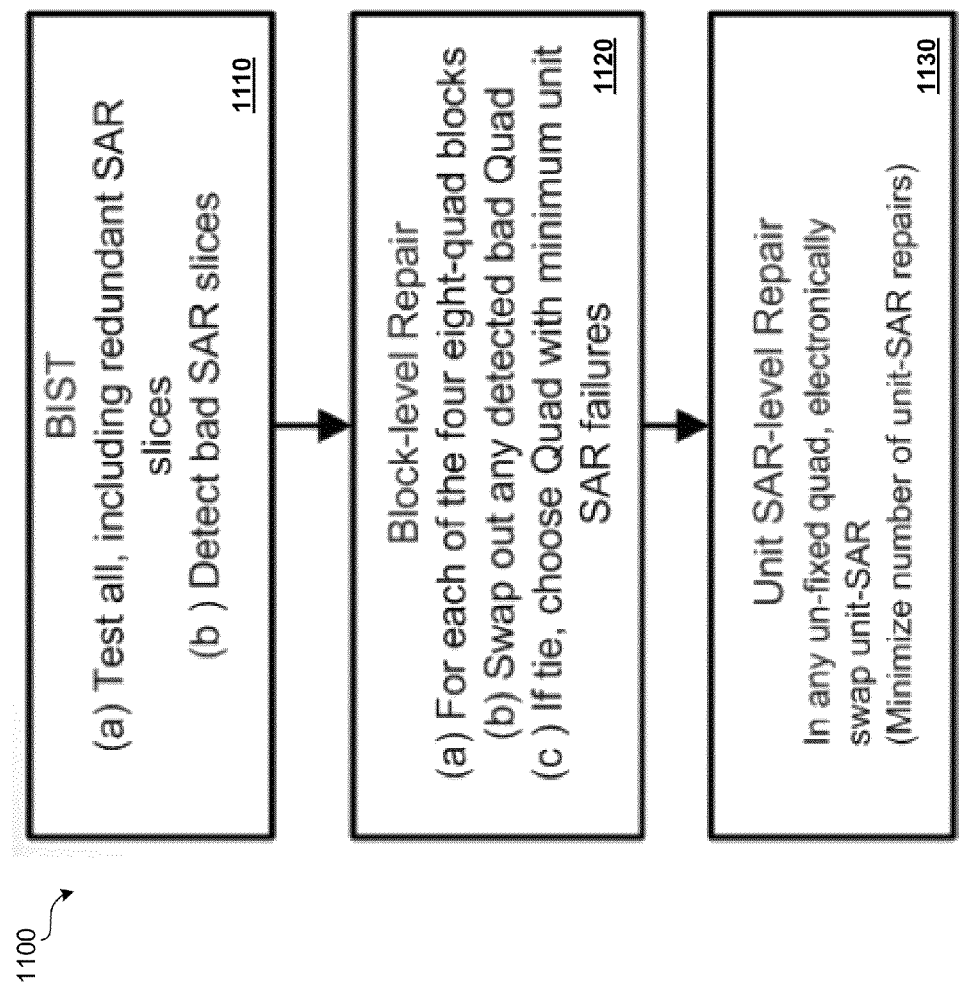
FIG. 11 is a flow diagram illustrating an example of a method for providing high-order and nested redundancy in an ADC.

FIG. 11 is a flow diagram illustrating an example of a method 110 for providing high-order and nested redundancy in an ADC. The method 1100 starts at operation block 1110, where a BIST engine runs a tests all SAR slices (e.g., SAR units) including the redundant SAR slices of an ADC (e.g., ADC 200A of FIG. 2A) in order to detect a failed (e.g., bad) SAR slice. At operation block 1120, a block level repair may be performed. For example, for each of the eight-ADC quads, a defective ADC quad may be replaced by a redundant ADC quad. When more than one quad is detected to be defective, the ADC quad with minimum SAR unit failure may be selected for electronic healing. At operation block 1130, the ADC quad with minimum SAR unit failure may be healed by electronic redundancy scheme described above with respect to FIG. 2.

Figure 12:
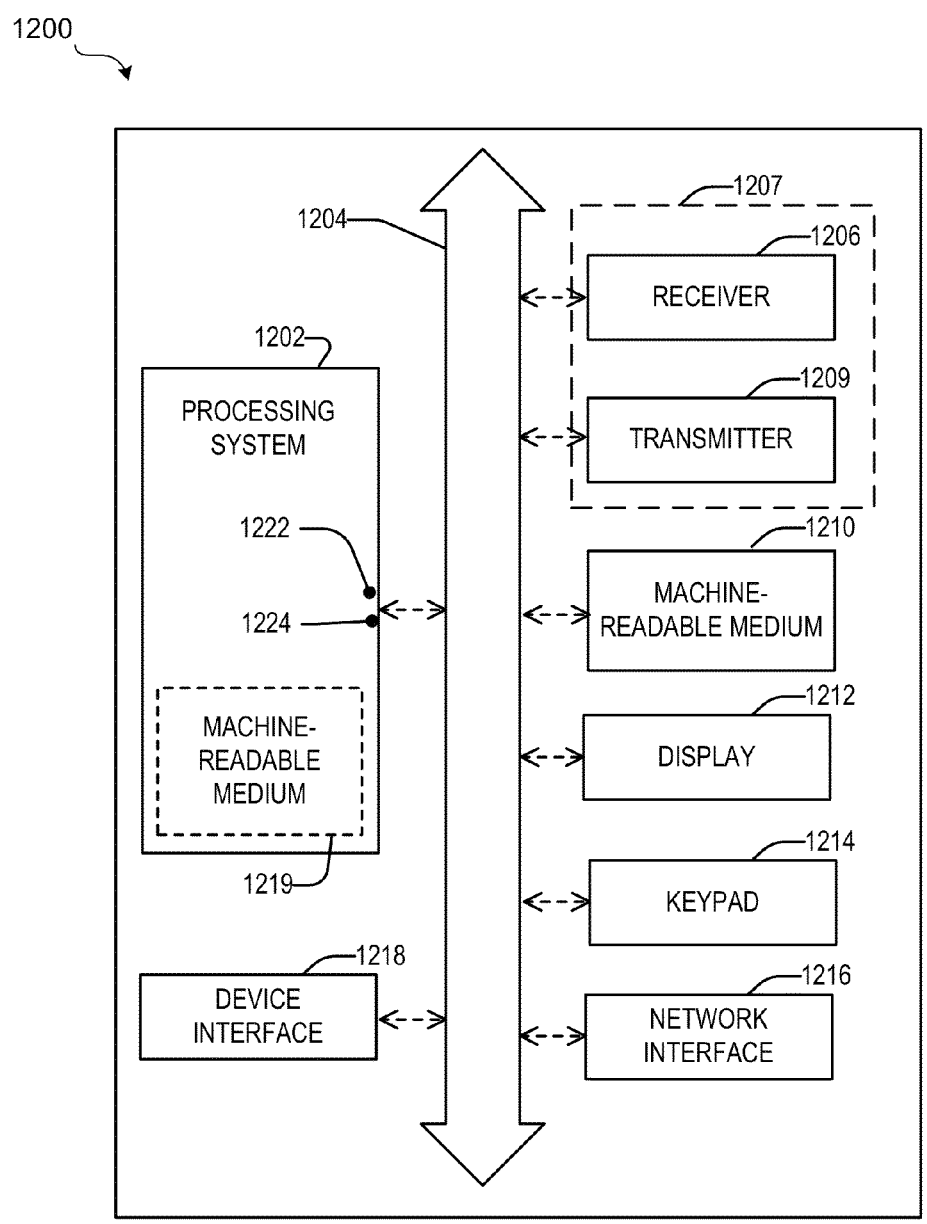
FIG. 12 is a diagram illustrating an example of a system including an ADC with high-order and nested redundancy schemes.

FIG. 12 is a diagram illustrating an example of a system including an ADC with high-order and nested redundancy schemes. The system 1200 may include a mixed-signal system such as a communication system (e.g., a wireless, an optical, or other a communication system) that includes the ADC such as the ADC 200A of FIG. 2A. In one or more aspects, the communication system may include a handheld device, such as a cell phone, a tablet, or a laptop computer. The system 1200 includes a processing system 1202, which may include one or more processors or one or more processing systems. A processor can be one or more processors. The processing system 1202 is capable of communication with a receiver 1206 and a transmitter 1209 through a bus 1204 or other structures or devices. In one or more aspects, the transmitter 1209 and the receiver 1206 may include an ADC, a DAC, or a SerDes that uses the physical, electronic and nested redundancy schemes disclosed herein. It should be understood that communication means other than busses can be utilized with the disclosed configurations. Processing system 1202 can perform the functionalities of the BIST engine discussed above. In some aspects, processing system 1202 may generate audio, video, multimedia, and/or other types of data to be provided to the transmitter 1209 for communication. In addition, audio, video, multimedia, and/or other types of data can be received at the receiver 1206, and processed by the processing system 1202.

The processing system 1202 may include a general-purpose processor or a specific-purpose processor for executing instructions and may further include a machine-readable medium 1219, such as a volatile or non-volatile memory, for storing data and/or instructions for software programs. The instructions, which may be stored in a machine-readable medium 1210 and/or 1219, may be executed by the processing system 1202 to control and manage access to the various networks, as well as provide other communication and processing functions. The instructions may also include instructions executed by the processing system 1202 for various user interface devices, such as a display 1212 and a keypad 1214. The processing system 1202 may include an input port 1222 and an output port 1224. Each of the input port 1222 and the output port 1224 may include one or more ports. The input port 1222 and the output port 1224 may be the same port (e.g., a bi-directional port) or may be different ports.

The processing system 1202 may be implemented using software, hardware, or a combination of both. By way of example, the processing system 1202 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 1219) may include storage integrated into a processing system such as might be the case with an ASIC. Machine-readable media (e.g., 1210) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art will recognize how best to implement the described functionality for the processing system 1202. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 1202 or one or more processors. Instructions can be, for example, a computer program including code.

A network interface 1216 may be any type of interface to a network (e.g., an Internet network interface), and may reside between any of the components shown in FIG. 12.

A device interface 1218 may be any type of interface to a device and may reside between any of the components shown in FIG. 12. A device interface 1218 may, for example, be an interface to an external device (e.g., USB device) that plugs into a port (e.g., USB port) of the system 1200.

A transceiver block 1207 may represent one or more transceivers, and each transceiver may include a receiver 1206 and a transmitter 1209. A functionality implemented in a processing system 1202 may be implemented in a portion of a receiver 1206, a portion of a transmitter 1209, a portion of a machine-readable medium 1210, a portion of a display 1212, a portion of a keypad 1214, or a portion of an interface 1216, and vice versa.

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. An apparatus (e.g., 200A of FIG. 2A) for providing time-interleaved analog-to-digital conversion with redundancy, comprising:
a plurality of analog-to-digital converter (ADC) blocks (e.g., 240 of FIG. 2A) coupled to one another to form a time-interleaved ADC, each ADC block including a plurality of ADC slices (e.g., 242 of FIG. 2A), wherein a count of the plurality of ADC blocks is M; and
a clock circuit (e.g., 210 of FIG. 2A) configured to provide a plurality of clock signals,
wherein:
a portion N of M ADC blocks are configured to be active, in a normal mode of operation (e.g., 240-1 to 240-4 of FIG. 2A),
N and M are integer numbers,
N is smaller than M,
a remaining portion of the M ADC blocks are redundant ADC blocks (e.g., 240-5 of FIG. 2A), and one or more of the redundant ADC blocks (e.g., 240-5 of FIG. 2A) are configured to be selectively active, in a healing mode of operation, and be swapped for one or more failed ADC blocks (e.g., 240-3 of FIG. 2B) using the plurality of clock signals (e.g., provided by 210 of FIG. 2A).

2. The apparatus of clause 1 or any other clause, wherein:
M comprises one of 17, 13, 9, or 5,
N comprises one of 16, 12, 8, or 4,
a count of the plurality of the ADC slices comprises one of 2, 4, or 8, and
one of the M ADC blocks is configured to be active, in the healing mode of operation, and be swapped for a failed ADC block.

3. The apparatus of clause 1 or any other clause, wherein:
a sampling rate of the time-interleaved ADC is higher than a sampling rate of each of the ADC blocks,
a sampling rate of each of the ADC blocks is higher than a sampling rate of each of the ADC slice,
the plurality of ADC blocks are grouped into a plurality of ADC groups,
each ADC group comprises a plurality of ADC blocks, and
each two adjacent ADC groups are configured to share a common redundant ADC block.

4. The apparatus of clause 1 or any other clause, wherein:
the clock circuit comprises:
an interleaver configured to generate a plurality of clock signals; and
a plurality of selector circuits, each selector circuit configured to couple a clock signal of the plurality of clock signals to a selected one of two clock lines,
the selected one of the two clock lines are configured to facilitate swapping of the one or more redundant ADC blocks for the one or more failed ADC blocks.

5. The apparatus of clause 1 or any other clause, wherein:
the one or more failed ADC blocks are the ADC blocks that include at least one defective ADC slice, and
the apparatus further comprises a built-in self-test (BIST) engine configured to detect failure of the one or more failed ADC blocks, and
the BIST engine is further configured to detect a failure of a defective ADC slice.

6. The apparatus of clause 1 or any other clause, wherein:
in the healing mode of operation, at least one of the failed ADC blocks is configured to be healed,
a healed ADC block is configured to be healed by one of a physical redundancy or an electronic redundancy,
the physical redundancy comprises a shared physical redundancy,
the shared physical redundancy comprises a shared redundant block redundancy and a shared ADC slice redundancy,
in the shared ADC slice redundancy, a redundant ADC slice is configured to be shared between two adjacent ADC blocks, and
in the shared ADC block redundancy, a redundant ADC block is configured to be shared between two adjacent ADC blocks.

7. The apparatus of clause 1 or any other clause, wherein:
in the healing mode of operation, at least one of the failed ADC blocks is configured to be healed,
the at least one of the failed ADC blocks includes one or more redundant ADC slices,
in the at least one of the failed ADC blocks, a count of the defective ADC slices is the same as a count of the one or more redundant ADC slices, the at least one of the failed ADC blocks is configured to be healed by swapping the defective ADC slices for the one or more redundant ADC slices.

8. The apparatus of clause 1 or any other clause, wherein:
in the healing mode of operation, at least one of the failed ADC blocks is configured to be healed, and
the at least one of the failed ADC blocks is configured to be healed by using electronic redundancy.

9. The apparatus of clause 1 or any other clause, wherein:
in the healing mode of operation, at least one of the failed ADC blocks is configured to be healed,
the at least one of the failed ADC blocks is configured to be healed by using electronic redundancy,
at least one of the ADC slices of the at least one of the failed ADC blocks that is configured to be healed by using electronic redundancy is configured to generate two digital output signals, and
the at least one of the failed ADC blocks is configured to use one of the two digital output signals as an output signal of a defective ADC slice.

10. A method (e.g., 1300 of FIG. 13) for providing redundancy in a time-interleaved analog-to-digital converter (ADC), comprising:
coupling a plurality of ADC blocks to form the time-interleaved ADC, each ADC block including a plurality of ADC slices, wherein a count of the plurality of ADC blocks is M (e.g., 1310 of FIG. 13);
configuring a clock circuit to provide a plurality of clock signals (e.g., 1320 of FIG. 13);
configuring a portion N of M ADC blocks to be active, in a normal mode of operation, wherein N and M are integer numbers, N is smaller than M, and a remaining portion of the M ADC blocks are redundant ADC blocks (e.g., 1330 of FIG. 13); and
configuring one or more of the redundant ADC blocks to be selectively active, in a healing mode of operation, and be swapped for one or more failed ADC blocks using the plurality of clock signals (e.g., 1340 of FIG. 13).

11. The method of clause 10 or any other clause, wherein:
M comprises one of 17, 13, 9, or 5,
N comprises one of 16, 12, 8, or 4,
a count of the plurality of the ADC slices comprises one of 2, 4, or 8, and
the method further comprises configuring one of the of M ADC blocks to be active, in the healing mode of operation, and be swapped for a failed ADC block.

12. The method of clause 10 or any other clause, wherein:
a sampling rate of the time-interleaved ADC is higher than a sampling rate of each of the ADC blocks,
a sampling rate of each of the ADC blocks is higher than a sampling rate of each of the ADC slices, and
the method further comprises:
grouping the plurality of ADC blocks into a plurality of ADC groups, each ADC group comprising a plurality of ADC blocks, and
configuring each two adjacent ADC groups to share a common redundant ADC block.

13. The method of clause 10 or any other clause, wherein:
configuring the clock circuit comprises:
configuring an interleaver to generate a plurality of clock signals;
coupling a plurality of selector circuits to the interleaver; and
configuring each selector circuit to couple a clock signal of the plurality of clock signals to a selected one of two clock lines; and the method further comprises configuring the selected one of the two clock lines to facilitate swapping of one or more of the redundant ADC blocks for the one or more failed ADC blocks.

14. The method of clause 10 or any other clause, wherein:
the one or more failed ADC blocks are the ADC blocks that include at least one defective ADC slice, and
the method further comprises configuring a built-in self-test (BIST) engine to detect failure of the one or more failed ADC blocks and a failure of a defective ADC slice.

15. The method of clause 10 or any other clause, further comprising:
configuring, in the healing mode of operation, at least one of the failed ADC blocks healed; and
configuring, in the healing mode of operation, at least one of the failed ADC blocks to be to be healed by one of a physical redundancy or an electronic redundancy, wherein the physical redundancy comprises a shared physical redundancy,
wherein the shared physical redundancy comprises shared redundant block redundancy and shared ADC slice redundancy, and the method further comprises:
performing the shared ADC slice redundancy by configuring a redundant ADC slice to be shared between two adjacent ADC blocks;
performing the shared ADC block redundancy by configuring a redundant ADC block to be shared between two adjacent ADC blocks; and
performing the shared physical redundancy by configuring a redundant ADC slice to be shared between two adjacent ADC blocks.

16. The method of clause 10 or any other clause, further comprising:
in the healing mode of operation, configuring at least one of the failed ADC blocks to be healed, wherein:
the at least one of the failed ADC blocks includes one or more redundant ADC slices, and
in the at least one of the failed ADC blocks, a count of the defective ADC slices is the same as a count of the one or more redundant ADC slices; and
configuring the at least one of the failed ADC blocks to be healed by swapping the defective ADC slices for the one or more redundant ADC slices.

17. The method of claim 10, further comprising:
in the healing mode of operation, configuring at least one of the failed ADC blocks to be healed; and
configuring the at least one of the failed ADC blocks to be healed by using electronic redundancy.

18. The method of clause 10 or any other clause, further comprising:
in the healing mode of operation, configuring at least one of the failed ADC blocks to be healed;
configuring the at least one of the failed ADC blocks to be healed by using electronic redundancy;
configuring at least one of the ADC slices of the at least one of the failed ADC blocks that is configured to be healed by using electronic redundancy to generate two digital output signals; and
configuring the at least one of the failed ADC blocks to use one of the two digital output signals as an output signal of a defective ADC slice.

19. A non-transitory machine-readable medium (e.g., 1219 of FIG. 1200) comprising instructions stored therein, the instructions executable by one or more processors to facilitate performing a method (e.g., 1300 of FIG. 13) for healing a time-interleaved analog-to-digital converter (ADC), the method comprising:

coupling a plurality of ADC blocks to form the time-interleaved ADC, each ADC block including a plurality of ADC slices, wherein a count of the plurality of ADC blocks is M;
configuring a clock circuit to provide a plurality of clock signals;
configuring a portion N of M ADC blocks to be active, in a normal mode of operation, wherein N and M are integer numbers, N is smaller than M, and a remaining portion of the M ADC blocks are redundant ADC blocks; and
configuring one or more of the redundant ADC blocks to be selectively active, in a healing mode of operation, and be swapped for one or more failed ADC blocks using the plurality of clock signals.

20. The non-transitory machine-readable medium of clause 19 or any other clause, wherein the method further comprises:
configuring one of the M ADC blocks to be active, in the healing mode of operation, and be swapped for a failed ADC block;
grouping the plurality of ADC blocks into a plurality of ADC groups, each ADC group comprising a plurality of ADC blocks;
configuring each two adjacent ADC groups to share a common redundant ADC block;
configuring a built-in self-test (BIST) engine to detect failure of the one or more failed ADC blocks and a failure of a defective ADC slice;
configuring, in the healing mode of operation, at least one of the failed ADC blocks to be healed;
configuring, in the healing mode of operation, at least one of the failed ADC blocks to be to be healed by one of a physical redundancy or an electronic redundancy, wherein the physical redundancy comprises a shared physical redundancy,
wherein the shared physical redundancy comprises shared redundant block redundancy and shared ADC slice redundancy, and the method further comprises:
performing the shared ADC slice redundancy by configuring a redundant ADC slice to be shared between two adjacent ADC blocks;
performing the shared ADC block redundancy by configuring a redundant ADC block to be shared between two adjacent ADC blocks; and
performing the shared physical redundancy by configuring a redundant ADC slice to be shared between two adjacent ADC blocks;
in the healing mode of operation, configuring the at least one of the failed ADC blocks to be healed by using electronic redundancy;
configuring at least one of the ADC slices of the at least one of the failed ADC blocks that is configured to be healed by using electronic redundancy to generate two digital output signals; and
configuring the at least one of the failed ADC blocks to use one of the two digital output signals as an output signal of a defective ADC slice.

21. A hardware apparatus comprising circuits configured to perform one or more methods or operations of any one of clauses 10-18 (e.g., Apparatus of FIG. 2A) or any other clauses.

22. A circuit comprising means (e.g., modules 1410-1440 of Apparatus of FIG. 14) adapted for performing one or more methods or operations of any one of clauses 10-18 or any other clauses.

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals or differential current signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, capacitors and resistors may be implemented using transistor or diode elements. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. An apparatus for providing time-interleaved analog-to-digital conversion with redundancy, comprising:
   a plurality of analog-to-digital converter (ADC) blocks coupled to one another to form a time-interleaved ADC, each ADC block including a plurality of ADC slices, wherein a count of the plurality of ADC blocks is M; and
   a clock circuit configured to provide a plurality of clock signals,
   wherein:
   a portion N of M ADC blocks are configured to be active, in a normal mode of operation,
   N and M are integer numbers,
   N is smaller than M,
   a remaining portion of the M ADC blocks are redundant ADC blocks, and
   one or more of the redundant ADC blocks are configured to be selectively active, in a healing mode of operation, and be swapped for one or more failed ADC blocks using the plurality of clock signals.

2. The apparatus of claim 1, wherein:
M comprises one of 17, 13, 9, or 5,
N comprises one of 16, 12, 8, or 4,
a count of the plurality of the ADC slices comprises one of 2, 4, or 8, and
one of the M ADC blocks is configured to be active, in the healing mode of operation, and be swapped for a failed ADC block.

3. The apparatus of claim 1, wherein:
a sampling rate of the time-interleaved ADC is higher than a sampling rate of each of the ADC blocks,
a sampling rate of each of the ADC blocks is higher than a sampling rate of each of the ADC slice,
the plurality of ADC blocks are grouped into a plurality of ADC groups,
each ADC group comprises a plurality of ADC blocks, and
each two adjacent ADC groups are configured to share a common redundant ADC block.

4. The apparatus of claim 1, wherein:
the clock circuit comprises:
   an interleaver configured to generate a plurality of clock signals; and
   a plurality of selector circuits, each selector circuit configured to couple a clock signal of the plurality of clock signals to a selected one of two clock lines,
the selected one of the two clock lines are configured to facilitate swapping of the one or more redundant ADC blocks for the one or more failed ADC blocks.

5. The apparatus of claim 1, wherein:
the one or more failed ADC blocks are the ADC blocks that include at least one defective ADC slice, and
the apparatus further comprises a built-in self-test (BIST) engine configured to detect failure of the one or more failed ADC blocks, and
the BIST engine is further configured to detect a failure of a defective ADC slice.

6. The apparatus of claim 1, wherein:
in the healing mode of operation, at least one of the failed ADC blocks is configured to be healed,
a healed ADC block is configured to be healed by one of a physical redundancy or an electronic redundancy,
the physical redundancy comprises a shared physical redundancy,
the shared physical redundancy comprises a shared redundant block redundancy and a shared ADC slice redundancy,
in the shared ADC slice redundancy, a redundant ADC slice is configured to be shared between two adjacent ADC blocks, and
in the shared ADC block redundancy, a redundant ADC block is configured to be shared between two adjacent ADC blocks.

7. The apparatus of claim 1, wherein:
in the healing mode of operation, at least one of the failed ADC blocks is configured to be healed,
the at least one of the failed ADC blocks includes one or more redundant ADC slices,
in the at least one of the failed ADC blocks, a count of the defective ADC slices is the same as a count of the one or more redundant ADC slices,
the at least one of the failed ADC blocks is configured to be healed by swapping the defective ADC slices for the one or more redundant ADC slices.

8. The apparatus of claim 1, wherein:
in the healing mode of operation, at least one of the failed ADC blocks is configured to be healed, and
the at least one of the failed ADC blocks is configured to be healed by using electronic redundancy.

9. The apparatus of claim 1, wherein:
in the healing mode of operation, at least one of the failed ADC blocks is configured to be healed,
the at least one of the failed ADC blocks is configured to be healed by using electronic redundancy,
at least one of the ADC slices of the at least one of the failed ADC blocks that is configured to be healed by using electronic redundancy is configured to generate two digital output signals, and
the at least one of the failed ADC blocks is configured to use one of the two digital output signals as an output signal of a defective ADC slice.

10. A method for providing redundancy in a time-interleaved analog-to-digital converter (ADC), comprising:
coupling a plurality of ADC blocks to form the time-interleaved ADC, each ADC block including a plurality of ADC slices, wherein a count of the plurality of ADC blocks is M;
configuring a clock circuit to provide a plurality of clock signals;
configuring a portion N of M ADC blocks to be active, in a normal mode of operation, wherein N and M are integer numbers, N is smaller than M, and a remaining portion of the M ADC blocks are redundant ADC blocks; and
configuring one or more of the redundant ADC blocks to be selectively active, in a healing mode of operation, and be swapped for one or more failed ADC blocks using the plurality of clock signals.

11. The method of claim 10, wherein:
M comprises one of 17, 13, 9, or 5,
N comprises one of 16, 12, 8, or 4,
a count of the plurality of the ADC slices comprises one of 2, 4, or 8, and
the method further comprises configuring one of the of M ADC blocks to be active, in the healing mode of operation, and be swapped for a failed ADC block.

12. The method of claim 10, wherein:
a sampling rate of the time-interleaved ADC is higher than a sampling rate of each of the ADC blocks,
a sampling rate of each of the ADC blocks is higher than a sampling rate of each of the ADC slices, and
the method further comprises:
grouping the plurality of ADC blocks into a plurality of ADC groups, each ADC group comprising a plurality of ADC blocks, and
configuring each two adjacent ADC groups to share a common redundant ADC block.

13. The method of claim 10, wherein:
configuring the clock circuit comprises:
configuring an interleaver to generate a plurality of clock signals;
coupling a plurality of selector circuits to the interleaver; and
configuring each selector circuit to couple a clock signal of the plurality of clock signals to a selected one of two clock lines; and
the method further comprises configuring the selected one of the two clock lines to facilitate swapping of one or more of the redundant ADC blocks for the one or more failed ADC blocks.

14. The method of claim 10, wherein:
the one or more failed ADC blocks are the ADC blocks that include at least one defective ADC slice, and
the method further comprises configuring a built-in self-test (BIST) engine to detect failure of the one or more failed ADC blocks and a failure of a defective ADC slice.

15. The method of claim 10, further comprising:
configuring, in the healing mode of operation, at least one of the failed ADC blocks to be healed; and
configuring, in the healing mode of operation, at least one of the failed ADC blocks to be healed by one of a physical redundancy or an electronic redundancy, wherein the physical redundancy comprises a shared physical redundancy,
wherein the shared physical redundancy comprises shared redundant block redundancy and shared ADC slice redundancy, and the method further comprises:
performing the shared ADC slice redundancy by configuring a redundant ADC slice to be shared between two adjacent ADC blocks;
performing the shared ADC block redundancy by configuring a redundant ADC block to be shared between two adjacent ADC blocks; and
performing the shared physical redundancy by configuring a redundant ADC slice to be shared between two adjacent ADC blocks.

16. The method of claim 10, further comprising:
in the healing mode of operation, configuring at least one of the failed ADC blocks to be healed, wherein:
the at least one of the failed ADC blocks includes one or more redundant ADC slices, and
in the at least one of the failed ADC blocks, a count of the defective ADC slices is the same as a count of the one or more redundant ADC slices; and
configuring the at least one of the failed ADC blocks to be healed by swapping the defective ADC slices for the one or more redundant ADC slices.

17. The method of claim 10, further comprising:
in the healing mode of operation, configuring at least one of the failed ADC blocks to be healed; and configuring the at least one of the failed ADC blocks to be healed by using electronic redundancy.

18. The method of claim 10, further comprising:
in the healing mode of operation, configuring at least one of the failed ADC blocks to be healed;
configuring the at least one of the failed ADC blocks to be healed by using electronic redundancy;
configuring at least one of the ADC slices of the at least one of the failed ADC blocks that is configured to be healed by using electronic redundancy to generate two digital output signals; and
configuring the at least one of the failed ADC blocks to use one of the two digital output signals as an output signal of a defective ADC slice.

19. A non-transitory machine-readable medium comprising instructions stored therein, the instructions executable by one or more processors to facilitate performing a method for healing a time-interleaved analog-to-digital converter (ADC), the method comprising:
coupling a plurality of ADC blocks to form the time-interleaved ADC, each ADC block including a plurality of ADC slices, wherein a count of the plurality of ADC blocks is M;
configuring a clock circuit to provide a plurality of clock signals;
configuring a portion N of M ADC blocks to be active, in a normal mode of operation, wherein N and M are integer numbers, N is smaller than M, and a remaining portion of the M ADC blocks are redundant ADC blocks; and
configuring one or more of the redundant ADC blocks to be selectively active, in a healing mode of operation, and be swapped for one or more failed ADC blocks using the plurality of clock signals.

20. The non-transitory machine-readable medium of claim 19, wherein the method further comprises:
configuring one of the M ADC blocks to be active, in the healing mode of operation, and be swapped for a failed ADC block;
grouping the plurality of ADC blocks into a plurality of ADC groups, each ADC group comprising a plurality of ADC blocks;
configuring each two adjacent ADC groups to share a common redundant ADC block;
configuring a built-in self-test (BIST) engine to detect failure of the one or more failed ADC blocks and a failure of a defective ADC slice;
configuring, in the healing mode of operation, at least one of the failed ADC blocks to be healed;
configuring, in the healing mode of operation, at least one of the failed ADC blocks to be to be healed by one of a physical redundancy or an electronic redundancy, wherein the physical redundancy comprises a shared physical redundancy,
wherein the shared physical redundancy comprises shared redundant block redundancy and shared ADC slice redundancy, and the method further comprises:
performing the shared ADC slice redundancy by configuring a redundant ADC slice to be shared between two adjacent ADC blocks;
performing the shared ADC block redundancy by configuring a redundant ADC block to be shared between two adjacent ADC blocks; and
performing the shared physical redundancy by configuring a redundant ADC slice to be shared between two adjacent ADC blocks;
in the healing mode of operation, configuring the at least one of the failed ADC blocks to be healed by using electronic redundancy;
configuring at least one of the ADC slices of the at least one of the failed ADC blocks that is configured to be healed by using electronic redundancy to generate two digital output signals; and
configuring the at least one of the failed ADC blocks to use one of the two digital output signals as an output signal of a defective ADC slice.

\* \* \* \* \*